United States Patent
Shin et al.

(10) Patent No.: US 11,793,053 B2
(45) Date of Patent: Oct. 17, 2023

(54) DISPLAY DEVICE HAVING VARIABLE LIGHT SHIELDING BLACK MATRIX LAYER

(71) Applicant: LG Display Co., Ltd., Seoul (KR)

(72) Inventors: Youngsub Shin, Goyang-si (KR); Keunyoung Kim, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 346 days.

(21) Appl. No.: 16/993,195

(22) Filed: Aug. 13, 2020

(65) Prior Publication Data
US 2021/0118962 A1  Apr. 22, 2021

(30) Foreign Application Priority Data
Oct. 22, 2019 (KR) .......................... 10-2019-0131171

(51) Int. Cl.
*H10K 59/50* (2023.01)
*G02F 1/01* (2006.01)
*H10K 59/126* (2023.01)

(52) U.S. Cl.
CPC ........... *H10K 59/50* (2023.02); *G02F 1/0126* (2013.01); *H10K 59/126* (2023.02)

(58) Field of Classification Search
CPC ..... G02F 1/0126; G02F 2202/14; G02B 5/23; H01L 27/3232; H01L 27/3272; H01L 27/322; H01L 51/5181; H01L 51/5284; H01L 33/44; H10K 59/50
See application file for complete search history.

(56) References Cited

U.S. PATENT DOCUMENTS

| | | | |
|---|---|---|---|
| 6,294,313 B1* | 9/2001 | Kobayashi | G03F 7/0005 430/302 |
| 2014/0374716 A1* | 12/2014 | Kim | H10K 59/50 257/40 |
| 2016/0146988 A1* | 5/2016 | Kim | H01L 51/5284 257/40 |
| 2017/0309859 A1* | 10/2017 | Lee | H01L 51/5281 |
| 2020/0098836 A1* | 3/2020 | Song | H01L 51/5281 |
| 2020/0348565 A1* | 11/2020 | Li | G02B 6/0061 |
| 2021/0225963 A1* | 7/2021 | Gong | G02F 1/13394 |

FOREIGN PATENT DOCUMENTS

KR   10-2006-0135425 A   12/2006

* cited by examiner

*Primary Examiner* — Eric K Ashbahian
(74) *Attorney, Agent, or Firm* — POLSINELLI PC

(57) ABSTRACT

A display device includes a substrate, a thin film transistor, a first electrode, an organic light emitting layer, a second electrode and a black matrix layer which is includes a shielding area and an opening area. The opening area is formed in a position corresponding to an emission area where light is emitted from the organic light emitting layer and the shielding area includes a variable light shielding unit which is adjacent to the opening area and has a light transmittance varying in accordance with a wavelength of incident light and a light shielding unit with a constant light transmittance.

15 Claims, 14 Drawing Sheets

DISPLAY DEVICE HAVING VARIABLE LIGHT SHIELDING BLACK MATRIX LAYER

CROSS-REFERENCE TO RELATED APPLICATION

This application claims the priority of Korean Patent Application No. 10-2019-0131171 filed on Oct. 22, 2019, which is hereby incorporated by reference in its entirety.

BACKGROUND

Field of the Disclosure

The present disclosure relates to a display device including a variable light shielding black matrix layer, and more particularly, to a display device including a variable light shielding black matrix layer in which a light transmittance varies depending on a wavelength of incident light to be change to a transmission mode and a shielding mode.

Description of the Background

Unlike a liquid crystal display device (LCD) which includes a backlight, an organic light emitting display device (OLED) does not require a separate light source. Therefore, the organic light emitting display device can be manufactured to be light and thin and has process advantages and has advantages in terms of power consumption due to the low voltage driving. Further, the organic light emitting display device has advantages in that color implementation is easy and a response speed is fast.

Generally, the organic light emitting display device includes an anode, a cathode, and an organic light emitting layer disposed therebetween. However, the cathode is formed using a metal material having a high reflectance so that the external light is reflected by the metal material to deteriorate a contrast ratio. Therefore, the organic light emitting display device includes a polarizing plate which absorbs external light below a cover substrate to reduce reflection by the external light.

The polarizing plate is a film having a predetermined level of light transmittance and absorbs external light and reflected light thereof to suppress the deterioration of the contrast ratio. However, the polarizing plate is an expensive member and has a relatively large thickness so that it is not appropriate for reduction of the thickness. Further, the polarizing plate also partially absorbs light emitted from the organic light emitting layer so that there is a limitation in lowering a driving voltage.

SUMMARY

In order to supplement the problems of the polarizing plate, it has been proposed to apply a black matrix layer instead of the polarizing plate. The black matrix layer absorbs external light to have a reflectance and a reflective visibility which are equal to those of the polarizing plate, but transmits light emitted from the emission area through an opening to reduce power consumption, increase life-span, and improve luminance. When the black matrix layer is applied, as a width of the opening is smaller, a reflection area is also reduced so that a reflective visibility may be further improved. However, a part of the emission area is shielded in accordance with a viewing angle so that luminance deterioration and color distortion may be caused in accordance with a viewing angle.

Accordingly, the present disclosure is to provide a display device which applies a black matrix layer to ensure reflective visibility which is equal to or better than the polarizing plate and minimize the luminance deterioration and color distortion in accordance with a viewing angle.

Moreover, the present disclosure provides a display device which is driven at a low voltage as compared with a display device including a polarizing plate to reduce power consumption, and improve life span, reflective visibility, and luminous efficiency.

The present disclosure is not limited to the above-mentioned features, which are not mentioned above, can be clearly understood by those skilled in the art from the following descriptions.

According to an aspect of the present disclosure, a display device includes: a substrate; a thin film transistor disposed on the substrate; a first electrode disposed on the thin film transistor; an organic light emitting layer disposed on the first electrode; a second electrode disposed on the organic light emitting layer; and a black matrix layer disposed on the second electrode and includes a shielding area and an opening area. The opening area is formed in a position corresponding to an emission area where light is emitted from the organic light emitting layer and the shielding area includes a variable light shielding unit which is adjacent to the opening area and has a light transmittance varying in accordance with a wavelength of incident light and a light shielding unit with a constant light transmittance. That is, the display device of the present disclosure applies the black matrix layer in which the light transmittance varies in accordance with the wavelength of the incident light to be changed to a shielding mode and a transmission mode to minimize the luminance deterioration in accordance with the viewing angle while improving the reflective visibility.

According to another aspect of the present disclosure, a display device includes: a substrate in which a plurality of pixel areas is defined; an organic light emitting diode disposed in each of the plurality of pixel areas; and a black matrix layer disposed on the organic light emitting diode and included an opening area which transmits light emitted from the organic light emitting diode and a shielding area which divides the plurality of pixel areas. The shielding area includes a variable light shielding unit which is adjacent to the opening area and includes a photochromic material which is reversibly discolored in accordance with a wavelength of incident light, and a light shielding unit includes a black pigment. Accordingly, the photochromic material which is reversibly discolored in accordance with the wavelength of the incident light is included in an area adjacent to the opening area of the black matrix layer to minimize the luminance deterioration in accordance with the viewing angle while maintaining a high reflective visibility.

Other detailed matters of the exemplary aspects are included in the detailed description and the drawings.

In the display device according to the present disclosure, the black matrix layer includes a variable light shielding unit which is changed to a transmission mode and a shielding mode in accordance with a wavelength of light which is incident in an area adjacent to an opening area. Accordingly, when external light is irradiated, the light shielding unit operates in the shielding mode to reduce reflectance due to the external light and provide excellent reflective visibility. Further, when light is emitted from the emission area, the variable light shielding unit operates in the transmission mode to increase a viewing angle as compared with the display device of the related art.

The display device according to the present disclosure may be driven at a voltage lower than that of the display device which includes a polarizing plate to reduce power consumption and contribute to the increase in the lifespan and provide excellent luminous efficiency.

The display device according to the present disclosure applies a black matrix layer which is changed to a transmission mode and a shielding mode to reduce a width of an emission area while minimizing the deterioration of luminance in accordance with the viewing angle. By doing this, the display device may be driven at a low voltage to contribute to reduction in the power consumption.

The display device according to the present disclosure further reduces the reflectance by adjusting a surface roughness of the variable light shielding unit that is changed to the transmission mode and the shielding mode. Further, the display device does not apply a light absorption film, but maintains the same level of reflectance as the display device which includes the light absorption film to contribute to reduction in cost.

The display device according to the present disclosure further includes a light diffusion film so that a luminance is maintained to be high without being lowered even at a viewing angle of 60°, but the external light reflectance is not increased.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
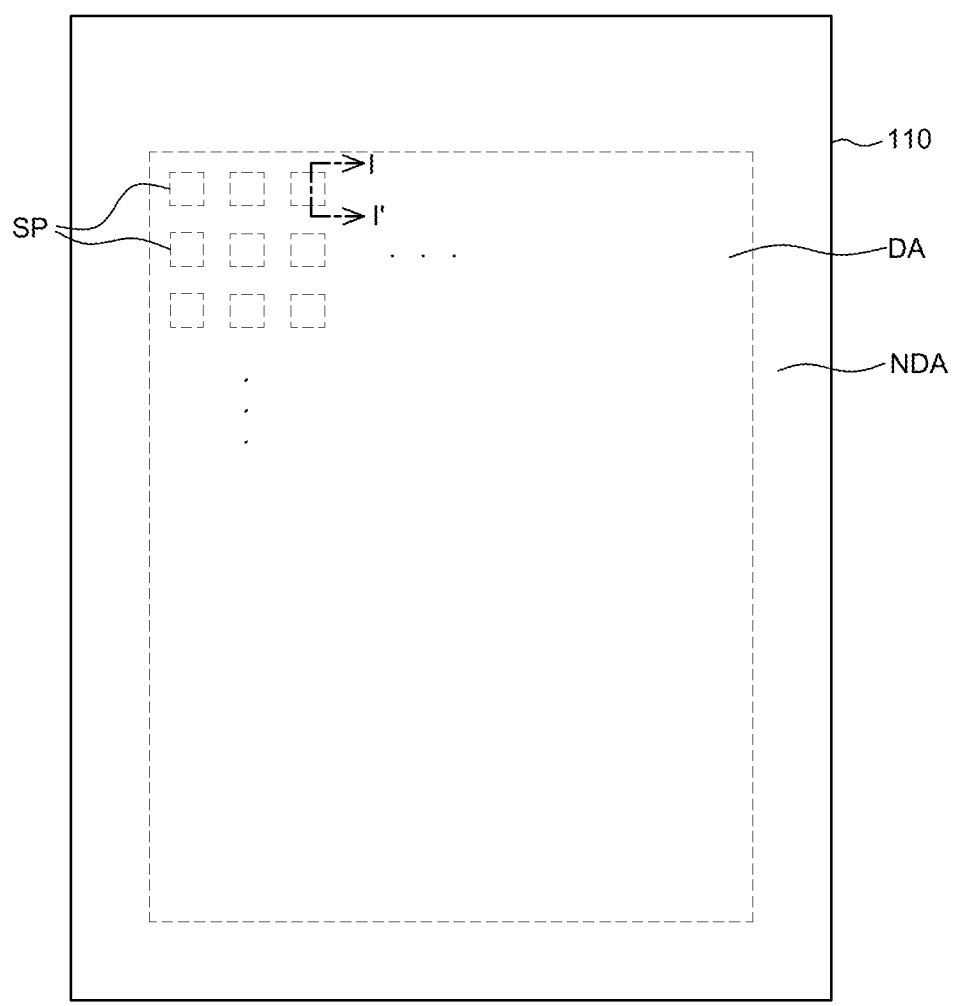
FIG. 1A is a plan view of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, the present disclosure will be described in detail with reference to accompanying drawings.

Figure 1B:
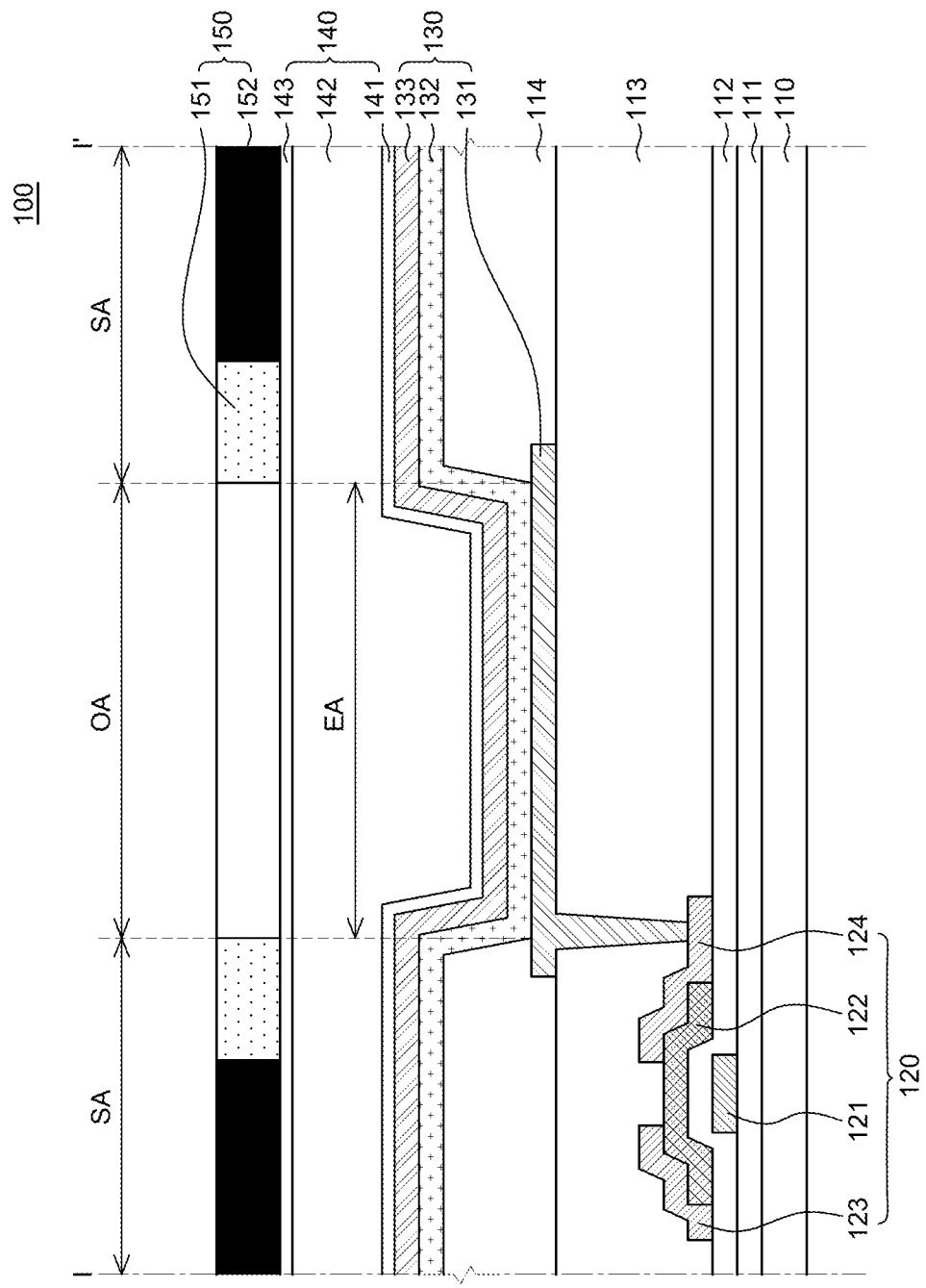
FIG. 1B is a cross-sectional view taken along I-I' of FIG. 1A.

FIG. 1A is a plan view of a display device according to an exemplary aspect of the present disclosure, and FIG. 1B is a cross-sectional view taken along I-I' of FIG. 1A. Referring to FIGS. 1A and 1B, a display device 100 according to an exemplary aspect of the present disclosure includes a substrate 110, a thin film transistor 120, an organic light emitting diode 130, an encapsulation layer 140, and a black matrix layer 150.

The substrate 110 is a support member for supporting various components of the display device 100 and may be configured by an insulating material. The substrate 110 may be formed of a material having flexibility. Therefore, the display device 100 according to the present disclosure may be applied to various flexible display devices, such as a foldable display device and a rollable display device. For example, the substrate 110 may be a plastic substrate formed of polyimide (PI), polyetherimide (PEI), polyethylene terephthalate (PET), polycarbonate (PC), polymethylmethacrylate (PMMA), polystyrene (PS), styrene-acrylnitrile copolymer (SAN), or silicone-acryl resin, but is not limited thereto.

Referring to FIG. 1A, the substrate 110 includes a display area DA and a non-display area NDA. The display area DA is an area where a plurality of sub pixels SP is disposed to display images. Each of the plurality of sub pixels SP is a minimum emission unit and for example, includes a red sub pixel, a green sub pixel, a blue sub pixel, and a white sub pixel, but is not limited thereto. Each of the plurality of sub pixels SP includes an organic light emitting diode 130. For example, the red sub pixel includes a red organic light emitting diode which emits red light. The non-display area NDA is an outer peripheral area which encloses the display area DA and in the non-display area, images are not displayed. In the non-display area NDA, various driving circuits for driving the organic light emitting diode 130 are disposed.

Referring to FIG. 1B, a buffer layer 111 is disposed on the substrate 110. The buffer layer 111 suppresses the permeation of the moisture and oxygen from the outside to protect various components of the display device 100. For example, the buffer layer 111 may be a single layer or a multi-layer of silicon nitride SiNx or silicon oxide SiOx, but is not limited thereto. The buffer layer 111 may be omitted in accordance with a structure or a characteristic of the display device 100 or formed only in the display area DA.

A thin film transistor 120 which includes a gate electrode 121, an active layer 122, a source electrode 123, and a drain electrode 124 is disposed on the substrate 110. The thin film transistor 120 may be used as a driving element of the display device 100. For example, the thin film transistor 120 has a structure in which the gate electrode 121 is disposed on the substrate 110, the gate insulating layer 112 and the active layer 122 is disposed on the gate electrode 121, and the source electrode 123 and the drain electrode 124 are disposed on the active layer 122, but is not limited thereto.

The gate electrode 121 may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

A gate insulating layer 112 is disposed on the gate electrode 121 to electrically insulate the gate electrode 121 from the active layer 122. The gate insulating layer 112 may be a single layer or a multi-layer of silicon nitride SiNx or silicon oxide SiOx, but is not limited thereto.

The active layer 122 is disposed so as to overlap the gate electrode 121. For example, the active layer 122 may be formed of an oxide semiconductor or amorphous silicon (a-Si), or polycrystalline silicon (poly-Si).

The source electrode 123 and the drain electrode 124 are disposed on the same layer to be spaced apart from each other. The source electrode 123 and the drain electrode 124 may be in contact with the active layer 122 to be electrically connected to the active layer 122.

A planarization layer 113 is disposed on the thin film transistor 120. The planarization layer 113 is an insulating layer which protects the thin film transistor 120 and makes the step due to components disposed on the substrate gentle. The planarization layer 113 may be a single layer or a multi-layer. For example, the planarization layer 113 may be formed of one of acrylic-based resin, epoxy resin, phenol resin, polyamide-based resin, polyimide-based resin, unsaturated polyester-based resin, polyphenylene-based resin, polyphenylene sulfide-based resin, benzocyclobutene, and photoresist, but is not limited thereto. The planarization layer 113 includes a contact hole which electrically connects the thin film transistor 120 and a first electrode 131 of the organic light emitting diode 130.

The organic light emitting diode 130 is disposed on the planarization layer 113. The organic light emitting diode 130 includes the first electrode 131, an organic light emitting layer 132, and a second electrode 133.

The first electrode 131 may be an anode which is disposed on the planarization layer 113 and supplies holes to the organic light emitting layer 132. The first electrode 131 may be formed of a transparent conductive material. For example, the transparent conductive material may include indium tin oxide (ITO), indium zinc oxide (IZO), or indium tin zinc oxide (ITZO), but is not limited thereto. When the display device 100 is driven as a top emission type, a reflective layer may be further provided below the first electrode 131.

The first electrode 131 is electrically connected to the drain electrode 124 of the thin film transistor 120 through a contact hole formed on the planarization layer 113. In FIG. 1B, it is illustrated that the first electrode 131 is electrically connected to the drain electrode 124 of the thin film transistor 120, but is not limited thereto.

A bank 114 is disposed on the planarization layer 113. The bank 114 is an insulating layer which separates adjacent sub pixels SP. The bank 114 is disposed to enclose an edge of the first electrode 131 and defines an emission area EA where the organic light emitting diode 130 emits light. The bank 114 may be formed to cover the edge of the first electrode 131 to open a part of the first electrode.

The organic light emitting layer 132 is disposed on the first electrode 131 and emits light having a specific color. The organic light emitting layer 132 may include at least one of a red light emitting layer, a green light emitting layer, a blue light emitting layer, and a white light emitting layer. The organic light emitting layer 132 may be configured by one light emitting layer or may be a structure in which a plurality of light emitting layers which emits different color light are laminated. The organic light emitting layer 132 may further include an organic layer such as a hole injection layer, a hole transport layer, an electron transport layer, and an electron injection layer, in addition to the light emitting layer. The organic layer smoothly injects the electrons or holes into the organic light emitting layer 132 so that the luminous efficiency of the organic light emitting layer 132 may be improved.

The second electrode 133 may be a cathode which is disposed on the organic light emitting layer 132 and injects the electrons in the organic light emitting layer 132. The second electrode 133 may be formed of a metal having a low work function to supply electrons to the organic light emitting layer 132. For example, the second electrode 133 may be formed of any one or more selected from a group consisting of conductive metals such as magnesium (Mg), silver (Ag), aluminum (Al), or calcium (Ca) or an alloy thereof. When the display device 100 is driven as a top emission type, the second electrode 133 may be formed to have a small thickness so that the light emitted from the organic light emitting layer 132 is transmitted therethrough. Further, the second electrode may be formed of a transparent conductive material such as indium tin oxide (ITO), indium zinc oxide (IZO), or indium tin zinc oxide (ITZO). Further, the second electrode 133 may have a structure in which the transparent conductive material and a conductive metal such as magnesium (Mg), silver (Ag), aluminum (Al), or calcium (Ca) are laminated, but is not limited thereto.

An encapsulation layer 140 is disposed on the second electrode 133. The encapsulation layer 140 is a sealing member which protects the organic light emitting diode 130 from moisture or oxygen which permeates from the outside and external impact. The encapsulation layer 140 may be formed as a single layer or a multi-layer. For example, the encapsulation layer 140 may have a triple-layered structure in which a first inorganic layer 141, an organic layer 142, and a second inorganic layer 143 are alternately laminated. For example, the first inorganic layer 141 and the second inorganic layer 143 may be formed of an inorganic material such as silicon nitride SiNx, silicon oxide SiOx, or silicon oxynitride SiON, but is not limited thereto. For example, the organic layer 142 may be formed to include one or more of polystyrene resin, acryl resin, epoxy resin, urea resin, isocyanate resin, and xylene resin, but is not limited thereto.

A black matrix layer 150 is disposed on the encapsulation layer 140. The black matrix layer 150 divides the plurality of sub pixels SP. The black matrix layer 150 suppresses various elements disposed in an area excluding the plurality of sub pixels SP from being visibly recognized by a user. The black matrix layer 150 includes a shielding area SA and an opening area OA. The shielding area SA blocks light from the inside or outside of the display device 100. The opening area OA transmits light from the inside or outside of the display device 100. The opening area OA may correspond to the emission area EA in which the light is emitted from the organic light emitting layer 132 of the organic light emitting diode 130. For example, a width of the opening area OA and a width of the emission area EA may be equal to each other.

In the shielding area SA, a variable light shielding unit 151 which is adjacent to the opening area OA and varies a light transmittance in accordance with a wavelength of incident light and a light shielding unit 152 in which the light transmittance is constant. The variable light shielding unit 151 may be disposed to enclose a part or all of the opening area OA.

The variable light shielding unit 151 includes a base resin and a photochromic material. The photochromic material is reversibly discolored in accordance with the wavelength of the incident light. For example, the photochromic material is discolored to black when light with a first wavelength is irradiated and is discolored to be transparent when light with a second wavelength is irradiated. That is, the photochromic material is discolored to black or to be transparent in accordance with the wavelength of the incident light so that the light transmittance varies. For example, the light with the first wavelength is ultraviolet ray and the light with the second wavelength is visible ray. For example, the photochromic material may be one or more of a thiophene-based compound, a benzothiophene-based compound, an azobenzene-based compound, and a spiropyran-based compound. The photochromic material is reversibly discolored to be transparent or black in accordance with the wavelength of the incident light. For example, a thiophene-based photochromic material or a benzothiophene-based photochromic material is reversibly discolored as follows: When the ultraviolet ray is irradiated, the thiophene-based photochromic material or the benzothiophene-based photochromic material shows black to provide a low light transmittance characteristic. When the visible ray is irradiated, the thiophene-based photochromic material or the benzothiophene-based photochromic material is discolored to be transparent to provide a high light transmittance. Further, when the ultraviolet ray is irradiated again, the thiophene-based photochromic material or the benzothiophene-based photochromic material is discolored to black.

The light shielding unit 152 includes a base resin and a black material. The black material may be a black pigment selected from a carbon-based pigment, a metal oxide-based pigment, and an organic-based pigment. For example, the carbon-based pigment may be carbon black. For example, the metal oxide-based pigment may be titanium black (TiNxOy) or Cu—Mn—Fe based black pigment, but is not limited thereto. For example, the organic-based pigment may be selected from lactam black, perylene black, and aniline black, but is not limited thereto. Further, as the black material, an RGB black pigment including a red pigment, a blue pigment, and a green pigment may be used. The light shielding unit 152 including the black material has a constant light transmittance regardless of the wavelength of the incident light.

The base resin included in the variable light shielding unit 151 and the light shielding unit 152 may be used by selecting a material known as a photosensitive resin. For example, the base resin may be formed from a composition containing a polymer binder, a monomer, and a photoinitiator. For example, the polymer binder may be one or more selected from cardo-based resin, epoxy-based resin, acrylate-based resin, siloxane-based resin, and polyimide, but is not limited thereto. The monomer may be a polyfunctional acrylate including two or more double bonds, and may act as a crosslinking agent for crosslinking. The monomer may be dipentaerythritol hexacrylate (DPHA), but is not limited thereto. The photoinitiator may be one or more selected from oxime, oxime ester, and acetophenone, but is not limited thereto.

Figure 2A:
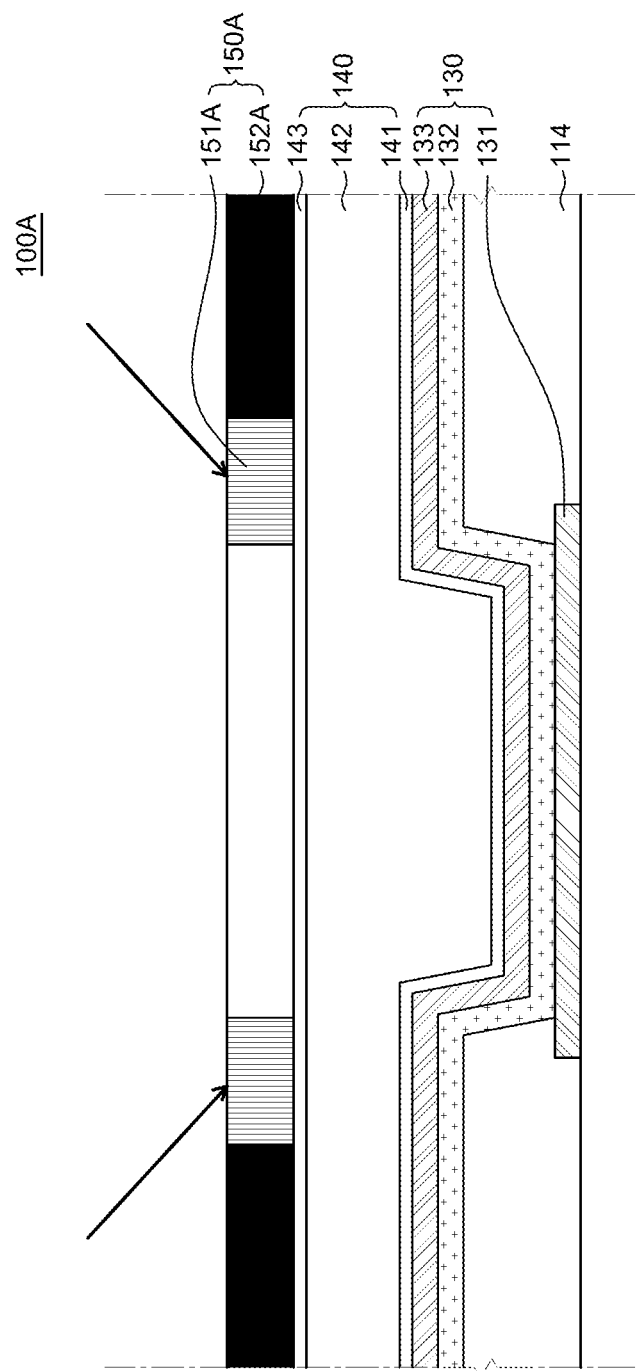
FIG. 2A is a cross-sectional view of a display device according to an exemplary aspect of the present disclosure when a variable light shielding unit of a black matrix layer operates in a shielding mode.
Figure 2B:
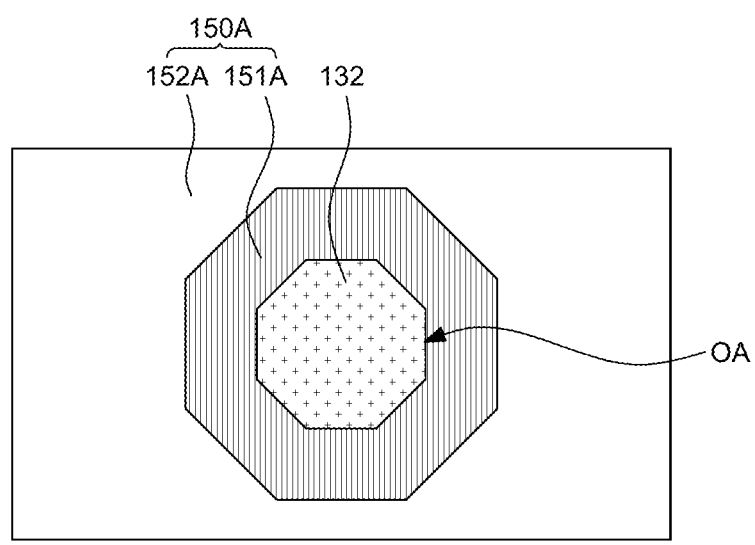
FIG. 2B is a plan view of a display device according to an exemplary aspect of the present disclosure when a variable light shielding unit of a black matrix layer operates in a shielding mode.
Figure 3A:
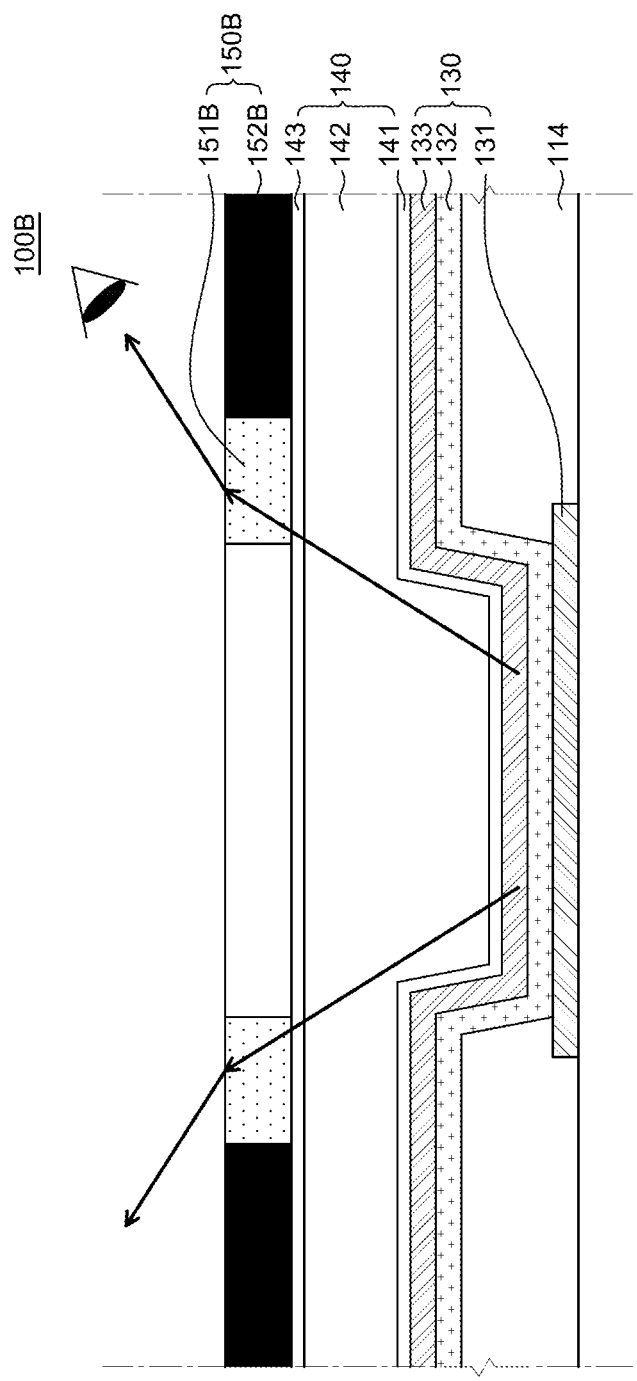
FIG. 3A is a cross-sectional view of a display device according to an exemplary aspect of the present disclosure when a variable light shielding unit of a black matrix layer operates in a transmission mode.
Figure 3B:
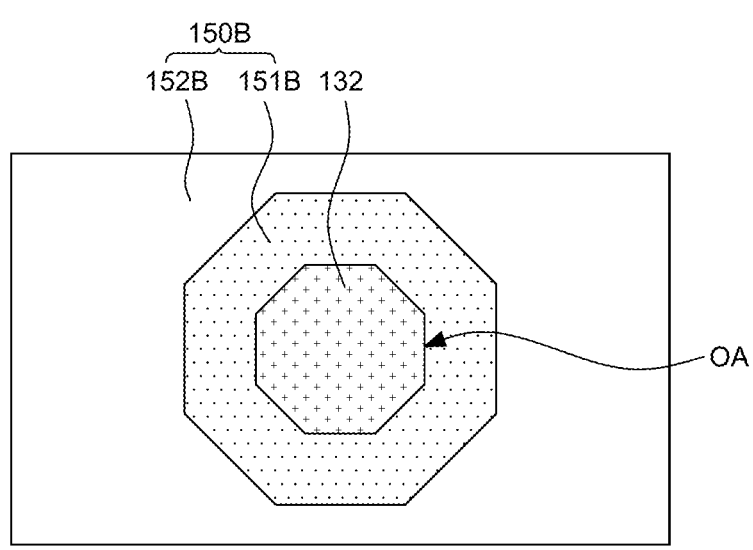
FIG. 3B is a plan view of a display device according to an exemplary aspect of the present disclosure when a variable light shielding unit of a black matrix layer operates in a transmission mode.

The variable light shielding unit 151 changes the mode to a transmission mode and a shielding mode in accordance with the wavelength of the incident light. FIGS. 2A and 2B are a cross-sectional view and a plan view of a display device according to an exemplary aspect of the present disclosure when a variable light shielding unit of a black matrix layer operates in a shielding mode. FIGS. 3A and 3B are a cross-sectional view and a plan view when a variable light shielding unit of a black matrix layer operates in a transmission mode. Hereinafter, the shielding mode and the transmission mode of the variable light shielding unit will be described in detail with reference to FIGS. 2A, 2B, 3A, and 3B.

First, referring to FIGS. 2A and 2B, a variable light shielding unit 151A is formed to be adjacent to the opening area OA of the black matrix layer 150A and enclose the entire side surface of the opening area OA. Further, a variable light shielding unit 151A is discolored to black by the light which is incident from the outside of a display device 100A to operate in a shielding mode. For example, the variable light shielding unit 151A is discolored to black by the ultraviolet ray incident from the outside to operate in a shielding mode, but is not limited thereto and it may vary depending on a photochromic material which configures the variable light shielding unit 151A. That is, when the display device 100A is turned off, the variable light shielding unit 151A is discolored to black by the light incident from the outside of the display device 100A and absorbs light incident into the display device 100A from the outside. Therefore, the external light is absorbed by both the variable light shielding unit 151A and the light shielding unit 152A so that the external light reflectance may be effectively reduced without using a polarizing plate.

Referring to FIGS. 3A and 3B, the variable light shielding unit 151B which is adjacent to the opening area OA is discolored to be transparent by the light emitted from the organic light emitting layer 132 to operate in a transmission mode. That is, when the display device 100B is turned on, the variable light shielding unit 151B is discolored to be transparent by the visible ray emitted from the organic light emitting layer 132 and transmits light emitted from the organic light emitting layer 132. Therefore, the light emitted from the organic light emitting layer 132 is transmitted through the opening area OA and the transparent variable light shielding unit 151B and light which is incident from the outside is absorbed by the light shielding unit 152B. Therefore, the external light reflectance may be effectively reduced without using the polarizing plate and deterioration of the luminance and the contrast ratio in accordance with the viewing angle may be minimized. Moreover, as compared with the display device which applies a polarizing plate, the display device may be driven at a low voltage so that the power consumption may be reduced and the lifespan may be improved.

In the meantime, when the variable light shielding unit 151B is discolored to be transparent to operate in a transmission mode, even though the external light reflectance may be reduced, the external light is refracted from the variable light shielding unit 151B. Therefore, the degree of reduction in external light reflectance is not large. Further, since the light emitted from the organic light emitting layer 132 is transmitted through the variable light shielding unit 151B, the luminance deterioration and color distortion in accordance with the viewing angle are minimized so that the viewing angle may be widened.

Figure 4:
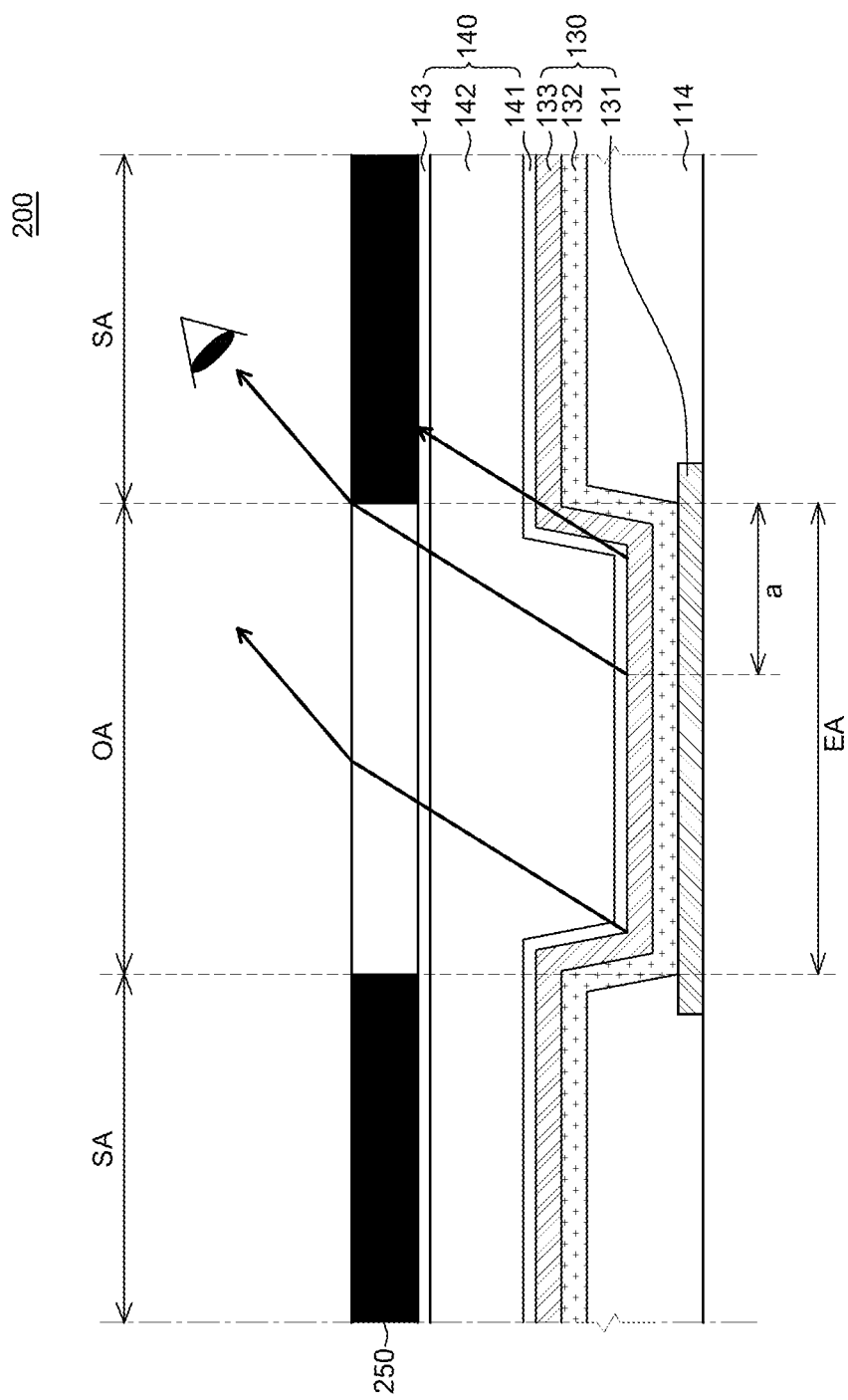
FIG. 4 is a cross-sectional view of a display device according to a comparative aspect including a black matrix layer which does not include a variable light shielding unit.

FIG. 4 is a cross-sectional view of a display device according to a comparative aspect including a black matrix layer which does not include a variable light shielding unit. Hereinafter, the improvement of the viewing angle of the present disclosure will be described in detail with reference to a display device according to a comparative aspect illustrated in FIG. 4 and the display device according to the exemplary aspect of the present disclosure illustrated in FIG. 3A.

Referring to FIG. 4, a black matrix layer of a display device 200 according to the comparative aspect is configured by an opening area OA corresponding to the emission area EA in which the light is emitted from the organic light emitting layer 132 and a shielding area SA including a light shielding unit 250 with a constant light transmittance regardless of the incident light. That is, the display device 200 according to the comparative aspect illustrated in FIG. 4 is substantially the same as a display device 100B of the present disclosure except that the variable light shielding unit 151B is not provided and an area of the variable light shielding unit 151B is also formed as a light shielding unit 250 with a constant light transmittance. Further, as illustrated in FIG. 4, when the widths of the emission area EA and the opening area OA are equal, an emission shielding area (a) in which light emitted from the emission area EA is partially shielded in accordance with the viewing angle is formed and the emission shielding area (a) is increased as the viewing angle is increased. Therefore, as the viewing angle is increased, the luminance is significantly deteriorated and color distortion is caused. In order to widen the viewing angle, when the width of the light shielding unit 250 is reduced to increase the opening area OA, the area of the light shielding unit 250 is relatively reduced so that the external light reflectance is increased. That is, the shielding area and the viewing angle form a trade-off relationship so that it is difficult to increase the viewing angle while reducing the external light reflectance by applying a black matrix layer with a configuration of the comparative aspect.

As described above, the display device 100B of the present disclosure applies a black matrix layer 150B including a variable light shielding unit 151B in which the light transmittance varies in accordance with the light incident onto a portion adjacent to the opening area OA. By doing this, the external light reflectance is effectively reduced and the deterioration of the luminance in accordance with the viewing angle is minimized. That is, when the variable light shielding unit 151B is discolored to be transparent by the light emitted from the organic light emitting layer 132 to operate in the transmission mode, the light emitted from the organic light emitting layer 132 may be output not only through the opening area OA, but also through the variable light shielding unit 151B. Therefore, in the display device 100B of the present disclosure, the trade-off relationship is resolved by the variable light shielding unit 151, so that external light reflectance is reduced and an extended viewing angle as compared with the display device 200 according to the comparative aspect is provided.

Figure 5:
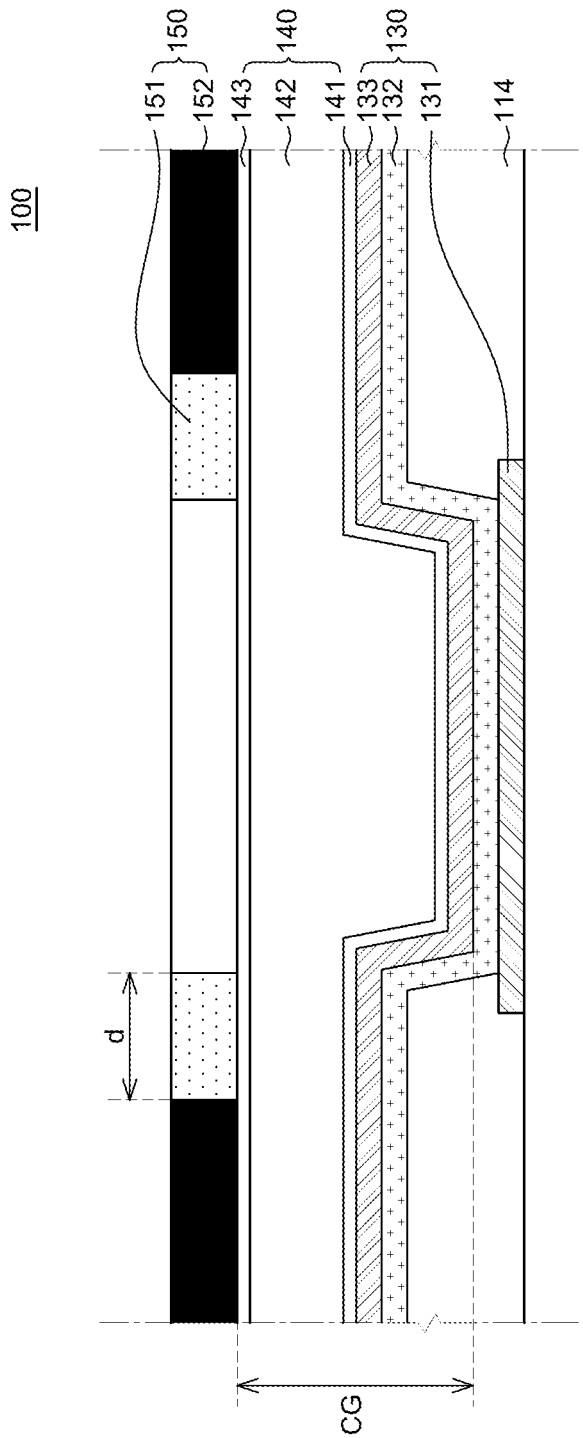
FIG. 5 is a view for explaining a correlation of a width of a variable light shielding unit of a black matrix layer and a cell gap, in a display device according to an exemplary aspect of the present disclosure.

FIG. 5 is a view for explaining a correlation of a width of a variable light shielding unit of a black matrix layer and a cell gap, in a display device according to an exemplary aspect of the present disclosure. A width d of the variable light shielding unit 151 is determined by a cell gap CG defined as a distance from a top surface of the organic light emitting layer 132 to a bottom surface of the black matrix layer 150. For example, the width d of the variable light shielding unit 151 may be 0.3 times to 0.7 times or 0.4 times to 0.6 times the cell gap CG. In this range, the external light reflectance may be effectively reduced and the luminance reduction in accordance with the viewing angle may be minimized. When the width d of the variable light shielding unit 151 is no more than 0.3 times the cell gap CG, if the viewing angle is large, the effect of suppressing the reduction of the luminance may be insignificant. When the width d of the variable light shielding unit 151 is no less than 0.7 times the cell gap CG, the wide viewing angle may be implemented but the reduction of the external light reflectance may be insufficient.

Figure 6:
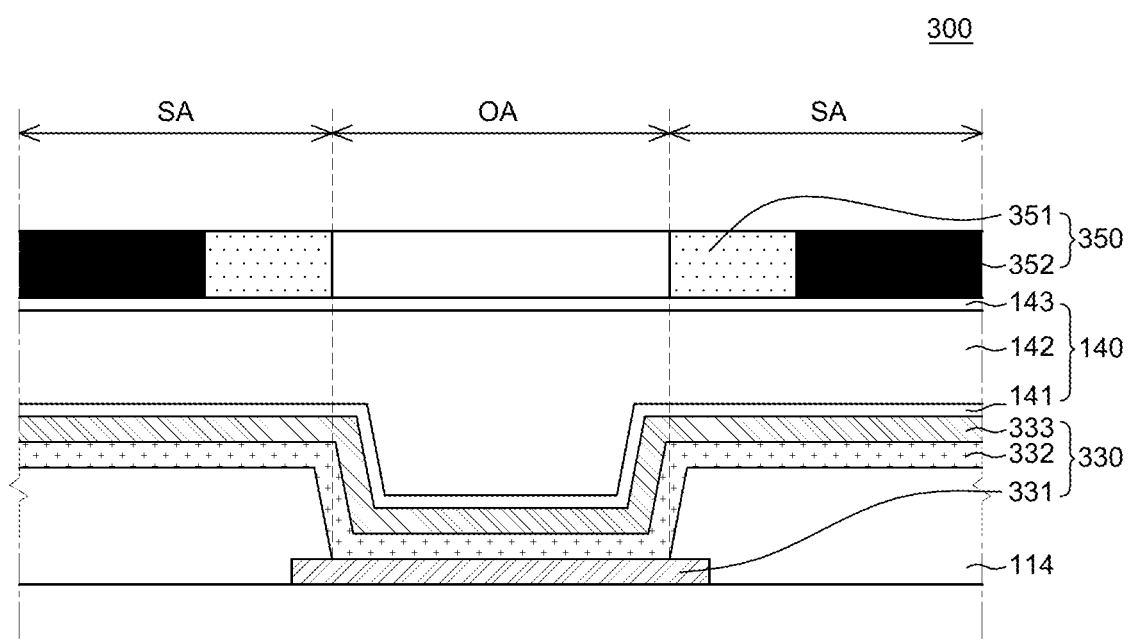
FIG. 6 is a cross-sectional view of a display device according to another exemplary aspect of the present disclosure.

FIG. 6 is a cross-sectional view of a display device according to another exemplary aspect of the present disclosure. Referring to FIG. 6, a display device 300 is substantially the same as the display device 100 illustrated in FIG. 1B except that areas of a first electrode 331 and an organic light emitting layer 332 are smaller than those of the display device 100. Therefore, a redundant description will be omitted.

In the display device 300 illustrated in FIG. 6, an organic light emitting diode 330 includes a first electrode 331 with a smaller area. When the area of the first electrode 331 is small, it is advantageous in that the power consumption is reduced. However, when the first electrode 331 with a smaller area is used, an emission area EA is also reduced so that there are problems in that the luminance deterioration in accordance with the viewing angle is significant and the viewing angle is limited.

In the display device 300 illustrated in FIG. 6, a variable light shielding unit 351 is provided in an area adjacent to the opening area OA so that the light emitted from the organic light emitting layer 332 transmits the variable light shielding unit 351 to suppress the luminance deterioration in accordance with the viewing angle. Therefore, even though the display device 300 of the present disclosure includes the first electrode 331 with a relatively smaller area and the organic light emitting layer 332, the luminance for every viewing angle is maintained to be equal and the power consumption is reduced, by the variable light shielding unit 351.

Figure 7:
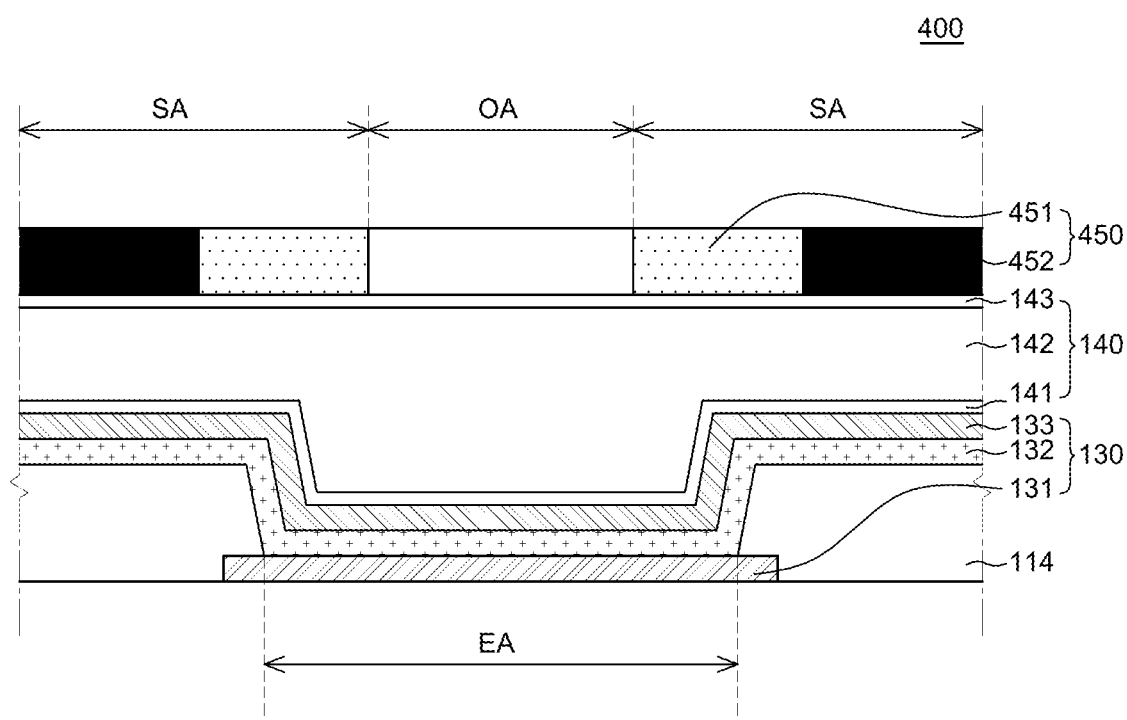
FIG. 7 is a cross-sectional view of a display device according to still another exemplary aspect of the present disclosure.

FIG. 7 is a cross-sectional view of a display device according to still another exemplary aspect of the present disclosure. Referring to FIG. 7, in a display device 400 according to still another exemplary aspect of the present disclosure, a variable light shielding unit 451 is disposed so as to overlap at least a part of the emission area EA. The display device 400 illustrated in FIG. 7 is substantially the same as the display device 100 of FIG. 1B except that the variable light shielding unit 451 is disposed so as to overlap at least a part of the emission area EA. Therefore, a description of a repeated configuration will be omitted.

Referring to FIG. 7, a variable light shielding unit 451 overlaps a part of the emission area EA. Therefore, a width of the opening area OA is smaller than a width of the emission area EA. As described above, even though the opening area OA has a smaller width than that of the emission area EA, the variable light shielding unit 451 adjacent to the opening area OA is discolored to be transparent by light emitted from the organic light emitting layer 132 to transmit light emitted from the organic light emitting layer 132. Further, some of light incident from the outside of the display device 400 is absorbed by the light shielding unit 452 and the other is refracted by the variable light shielding unit 452 so that influence due to the external light may be minimized. Therefore, the luminance is high and the reflective visibility is excellent. Further, as the variable light shielding unit 451 overlaps a part of the emission area EA, when the variable light shielding unit 451 is discolored to black by the external light to operate in a shielding mode, an area which shields the external light is increased so that the excellent reflective visibility may be achieved.

Figure 8:
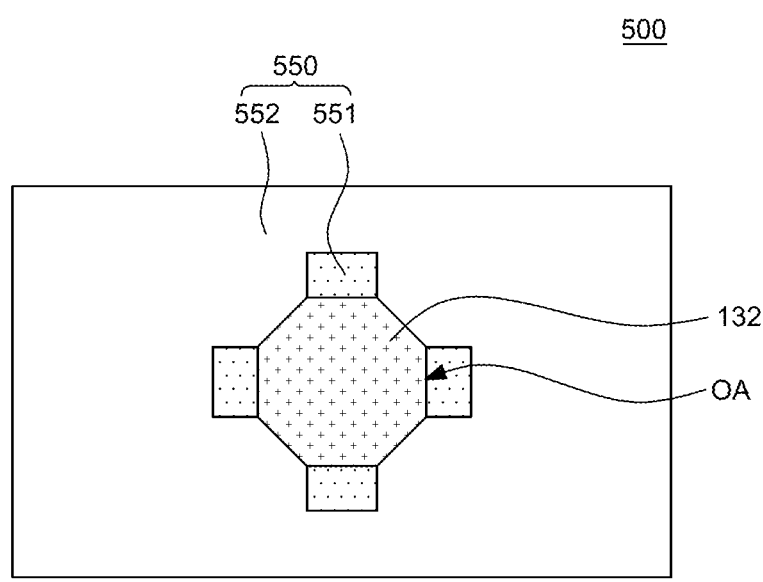
FIG. 8 is a plan view of a display device according to another exemplary aspect of the present disclosure when a variable light shielding unit of a black matrix layer operates in a transmission mode.

FIG. 8 is a plan view of a display device according to another exemplary aspect of the present disclosure when a variable light shielding unit of a black matrix layer operates in a transmission mode. Referring to FIG. 8, a display device 500 according to still another exemplary aspect of the present disclosure is substantially the same as the display device 100B illustrated in FIGS. 3A and 3B except that a variable light shielding unit 551 of a black matrix layer 550 is disposed so as to enclose a part of a side surface of the opening area OA. Therefore, a redundant description will be omitted.

Referring to FIG. 8, in the display device 500, the variable light shielding unit 551 is disposed to enclose a part of the side surface of the opening area OA through which light emitted from the organic light emitting layer 132 is transmitted and a light shielding unit 552 is disposed in an area excluding the variable light shielding unit. That is, in the display device 500 illustrated in FIG. 8, the area of the light shielding unit 552 is relatively larger than that of the display device 100B illustrated in FIGS. 3A and 3B. Accordingly, it may be more advantageously applied to a display device used in an environment where the influence of external light is relatively large.

Figure 9:
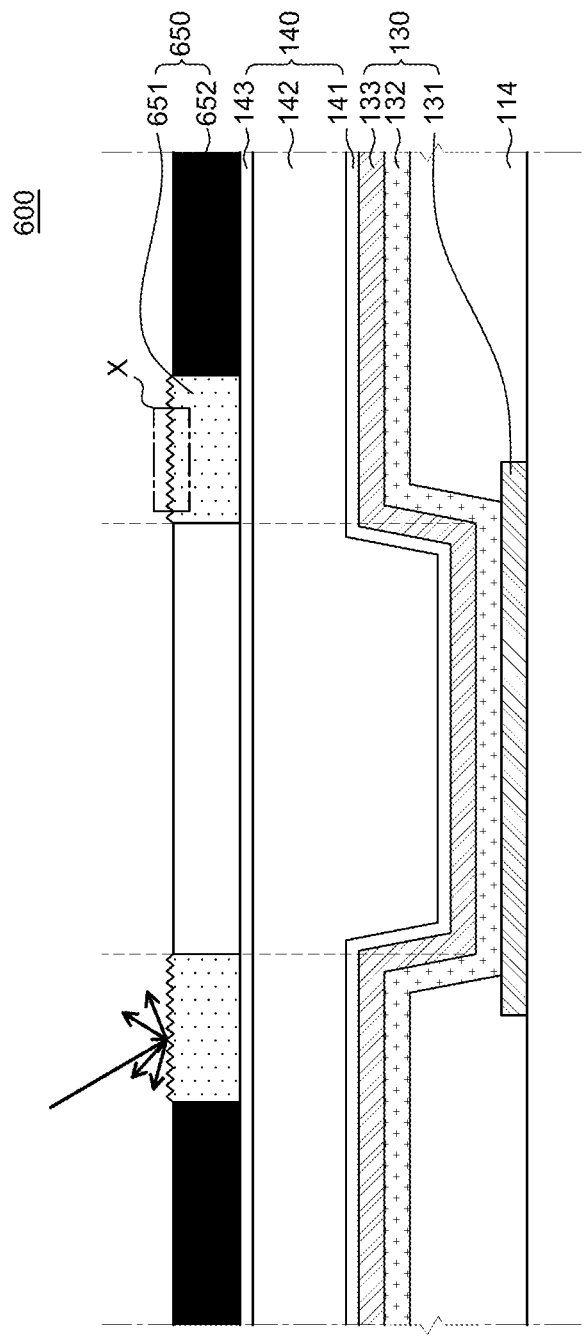
FIG. 9 is a cross-sectional view of a display device according to still another exemplary aspect of the present disclosure.

FIG. 9 is a cross-sectional view of a display device according to still another exemplary aspect of the present disclosure. Referring to FIG. 9, a display device 600 according to still another exemplary aspect of the present disclosure is substantially the same as the display device 100 illustrated in FIG. 1B except that unevenness structure is formed on an upper surface of a variable light shielding unit 651.

Referring to FIG. 9, the display device 600 includes a black matrix layer 650 including a variable light shielding unit 651 in which unevenness structure is formed on an upper surface and a light transmittance varies in accordance with a wavelength of the incident light and a light shielding unit 652 with a constant light transmittance. The unevenness formed on the upper surface of the variable light shielding unit 651 scatters light which is incident from the outside of the display device 600. That is, the variable light shielding unit 651 including an unevenness structure makes it difficult for external light to enter the display device 600 from the outside, thereby further reducing the external light reflectance.

For example, a surface roughness of the upper surface of the variable light shielding unit 651 may be 400 nm to 700 nm or 500 nm to 700 nm. When the surface roughness is in this range, the external light is scattered by the unevenness so that the external light reflectance may be effectively reduced. In order to ensure excellent reflective visibility, the external light reflectance is desirably 5% or lower. From this viewpoint, the surface roughness of the upper surface of the variable light shielding unit 651 may be 450 nm to 800 nm.

Generally, in order to reduce the external light reflectance, when the black matrix layer is applied instead of a polarizing plate, a light absorption film is disposed on the black matrix layer to ensure a reflectance which is equal to that of the polarizing plate. However, when the unevenness structure is provided on the upper surface of the variable light shielding unit 651, the external light reflectance which is equal to or higher than that of the polarizing plate may be implemented without using the light absorption film. For example, when the unevenness structure is formed on the upper surface of the variable light shielding unit 651 to have the surface roughness of 500 nm to 700 nm, the external light reflectance is less than 5%. Further, when the light absorption film is additionally disposed, the external light reflectance may be lowered to be less than 3.5%.

Figure 10:
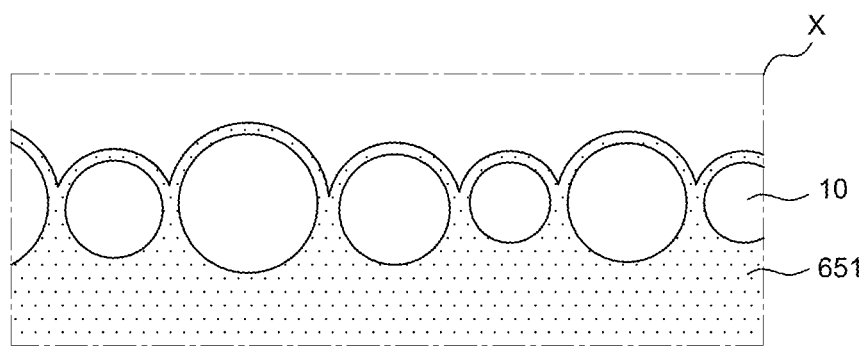
FIG. 10 is an enlarged view of area X of FIG. 9.

FIG. 10 is an enlarged view of an area X of FIG. 9. Referring to FIG. 9, in order to form an unevenness structure on an upper surface of the variable light shielding unit 651, transparent polymer beads 10 are dispersed in the variable light shielding unit 651. The transparent polymer beads 10 impart the unevenness to the upper surface of the variable light shielding unit 651 to scatter the external light and reduce the external light reflectance.

For example, the transparent polymer beads 10 may be spherical particles formed of polymethyl methacrylate (PMMA), polystyrene (PS), and silica ($SiO_2$), but is not limited thereto. Further, an average diameter of the transparent polymer bead 10 may be 0.1 to 1 μm. In this range, an unevenness structure with a desired level of surface roughness is formed on the upper surface of the variable light shielding unit 651 to reduce the external reflectance.

The surface roughness of the variable light shielding unit 651 may be adjusted depending on a particle size of a transparent polymer bead 10, a degree of protrusion, and an interval between particles. The higher surface roughness, the larger the particle size of the transparent polymer bead 10, the larger the protrusion degree of the particle, and the smaller the interval between particles. By using this, the surface roughness of the variable light shielding unit 652 may be adjusted.

Figure 11:
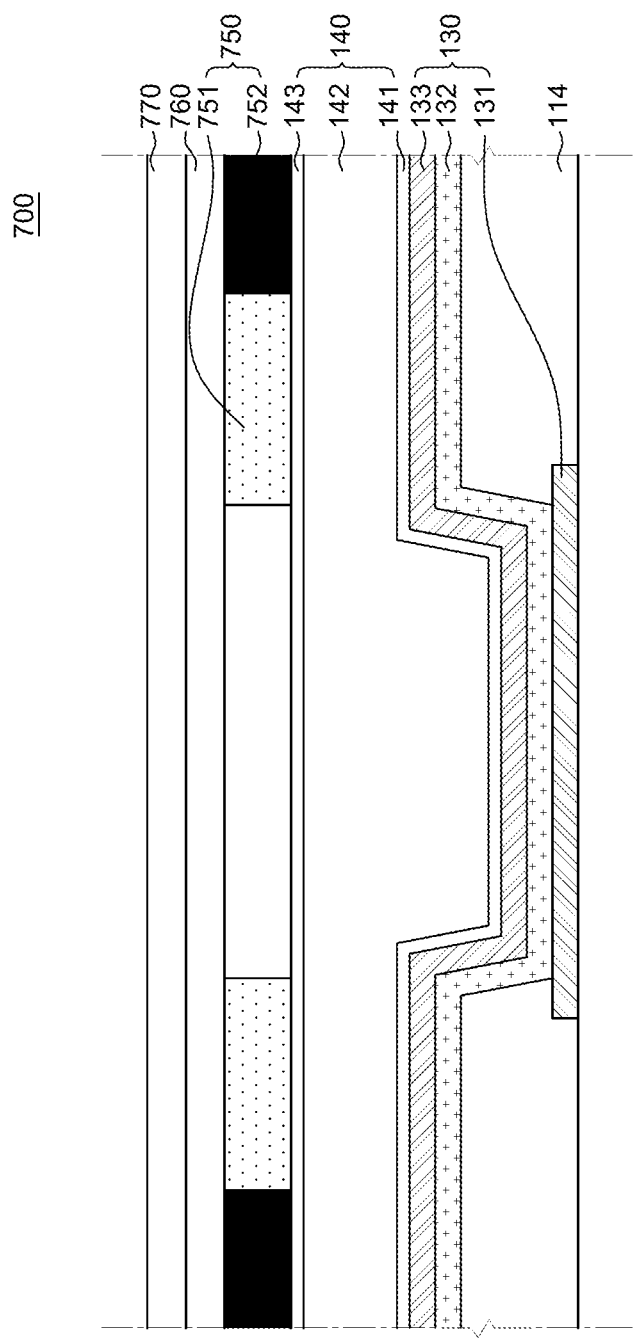
FIG. 11 is a cross-sectional view of a display device according to still another exemplary aspect of the present disclosure.

FIG. 11 is a cross-sectional view of a display device according to still another exemplary aspect of the present disclosure. A display device 700 illustrated in FIG. 11 is substantially the same as the display device 100 illustrated in FIG. 1B except that the display device 700 further includes a protective layer 760 disposed on a black matrix layer 750 and an optical control layer 770 disposed on the protective layer 760. Therefore, a redundant description will be omitted.

The protective layer 760 is disposed on the black matrix layer 750 to suppress the deterioration of the display device 700 by blocking the permeation of the moisture and air from the outside. Further, the protective layer 760 serves as a buffer member which protects components in the display device 700 from the external impact.

The optical control layer 770 is disposed on the protective layer 760. The optical control layer 770 may be a light absorption film or a light diffusion film. The light absorption film has a predetermined light transmittance and in the light absorption film, a light absorption material is dispersed to absorb light incident from the outside. The light diffusion film is a film in which transparent polymer beads are dispersed or an unevenness structure is provided on a surface so that light incident from the outside is diffused to reduce the external light reflectance.

When the optical control layer 770 such as the light absorption film or the light diffusion film is included, the external light reflectance is reduced by the optical control layer. Therefore, the width of the variable light shielding unit 751 is increased to implement a wide viewing angle and minimize the luminance reduction even at a viewing angle of 60°.

For example, when the optical control layer 770 is included, the width of the variable light shielding unit 751 may be 0.5 times to 0.7 times the cell gap CG which is a distance between a top surface of the organic light emitting layer 132 and a bottom surface of the black matrix layer 750. As described above, even though the width of the variable light shielding unit 751 is increased, the external light reflectance is not increased, and the luminance degradation in accordance with the viewing angle may be more effectively suppressed.

The exemplary aspects of the present disclosure can also be described as follows:

According to an aspect of the present disclosure, there is provided a display device. The display device comprises a substrate, a thin film transistor disposed on the substrate, a first electrode disposed on the thin film transistor, an organic light emitting layer disposed on the first electrode, a second electrode disposed on the organic light emitting layer and a black matrix layer disposed on the second electrode and includes a shielding area and an opening area. Further, the opening area corresponds to an emission area where light is emitted from the organic light emitting layer, and the shielding area includes a variable light shielding unit which is adjacent to the opening area and has a light transmittance varying in accordance with incident light and a light shielding unit with a constant light transmittance.

The variable light shielding unit may include a photochromic material reversibly discolored in accordance with a wavelength of incident light and the light shielding unit may include a black material.

The photochromic material may be one or more of a thiophene-based compound, a benzothiophene-based compound, an azobenzene-based compound, and a spiropyran-based compound.

The photochromic material may be discolored to black when light with a first wavelength is irradiated and may be discolored to be transparent when light with a second wavelength is irradiated.

The variable light shielding unit may be discolored to black by light being incident from the outside of the display device to operate in a shielding mode and may be discolored to be transparent by light emitted from the organic light emitting layer to operate in a transmission mode.

When ultraviolet ray is irradiated, the variable light shielding unit may be discolored to black to operate in a shielding mode and when visible ray is irradiated, the variable light shielding unit may be discolored to be transparent to operate in a transmission mode.

A width of the variable light shielding unit may be 0.3 times to 0.7 times a distance (cell gap) between the organic light emitting layer and the black matrix layer.

The opening area may include a plurality of edges and the variable light shielding unit may be formed to be adjacent to at least one edge of the plurality of edges.

The variable light shielding unit may be disposed so as to overlap at least a part of the emission area.

A surface roughness of an upper surface of the variable light shielding unit may be 400 nm to 700 nm.

The variable light shielding unit further may include a transparent polymer bead and may have an unevenness structure on the upper surface.

The display device may further comprise an optical control layer disposed on the black matrix layer.

According to another aspect of the present disclosure, there is provided a display device. The display device comprises a substrate in which a plurality of pixel areas is defined, an organic light emitting diode disposed in each of the plurality of pixel areas and a black matrix layer disposed on the organic light emitting diode and included an opening area which transmits light emitted from the organic light emitting diode and a shielding area which divides the plurality of pixel areas, wherein the shielding area includes a variable light shielding unit which is adjacent to the opening area and includes a photochromic material which is reversibly discolored in accordance with a wavelength of incident light, and a light shielding unit includes a black pigment.

The photochromic material may be discolored to black when light with a first wavelength is irradiated from the outside of the display device and may be discolored to be transparent when light with a second wavelength is irradiated from the organic light emitting diode.

The photochromic material may be one or more of a thiophene-based compound, a benzothiophene-based compound, an azobenzene-based compound, and a spiropyran-based compound.

When ultraviolet ray is irradiated from the outside of the display device, the variable light shielding unit may be discolored to black to operate in a shielding mode and when visible ray emitted from the organic light emitting diode is irradiated, the variable light shielding unit may be discolored to be transparent to operate in a transmission mode.

The organic light emitting diode may include an anode, an organic light emitting layer disposed on the anode, a cathode disposed on the organic light emitting layer and a width of the variable light shielding unit may be 0.3 times to 0.7 times a distance (cell gap) between the organic light emitting layer and the black matrix layer.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a substrate where a plurality of sub pixel areas is defined;
   a thin film transistor disposed on the substrate;
   an organic light emitting diode disposed in each of the plurality of sub pixel areas, comprising:
   a first electrode disposed on the thin film transistor;
   an organic light emitting layer disposed on the first electrode; and
   a second electrode disposed on the organic light emitting layer;
   a bank disposed on the thin film transistor to expose at least a portion of the first electrode and separating adjacent sub pixels; and
   a black matrix layer disposed on the second electrode and includes a shielding area and an opening area,
   wherein the opening area overlaps with an emission area where light is emitted from the organic light emitting layer, and the shielding area overlaps with the bank,
   wherein the shielding area includes a variable light shielding unit which varies light transmittance in accordance with incident light and a light shielding unit with a constant light transmittance,
   wherein the variable light shielding unit is disposed to enclose the opening area of each of the plurality of sub pixel, and
   wherein a width of the variable light shielding unit is 0.3 times to 0.7 times a distance between the organic light emitting layer and the black matrix layer.

2. The display device according to claim 1, wherein the variable light shielding unit includes a photochromic material reversibly discolored in accordance with a wavelength of incident light, and
   wherein the light shielding unit includes a black material.

3. The display device according to claim 2, wherein the photochromic material is one or more of a thiophene-based compound, a benzothiophene-based compound, an azobenzene-based compound, and a spiropyran-based compound.

4. The display device according to claim 3, wherein the photochromic material is discolored to black when light with a first wavelength is irradiated and is discolored to be transparent when light with a second wavelength is irradiated.

5. The display device according to claim 1, wherein the variable light shielding unit is discolored to black by light incident from outside of the display device to operate in a shielding mode and is discolored to be transparent by light emitted from the organic light emitting layer to operate in a transmission mode.

6. The display device according to claim 5, wherein, when ultraviolet ray is irradiated, the variable light shielding unit is discolored to black to operate in a shielding mode and when visible ray is irradiated, the variable light shielding unit is discolored to be transparent to operate in a transmission mode.

7. The display device according to claim 1, wherein the variable light shielding unit is extended to overlaps with at least a part of the emission area.

8. The display device according to claim 1, wherein a surface roughness of an upper surface of the variable light shielding unit is 400 nm to 700 nm.

9. The display device according to claim 8, wherein the variable light shielding unit further includes a transparent polymer bead and has an unevenness structure on the upper surface.

10. The display device according to claim 1, further comprising an optical control layer disposed on the black matrix layer.

11. A display device, comprising:
    a substrate where a plurality of sub pixel areas is defined;
    an organic light emitting diode disposed in each of the plurality of sub pixel areas;
    a bank which separates adjacent sub pixels; and
    a black matrix layer disposed on the organic light emitting diode and having an opening area which transmits light emitted from the organic light emitting diode and a shielding area which overlaps with the bank to divide the plurality of sub pixel areas and including a light shielding unit and a variable light shielding unit,
    wherein the light shielding unit includes a black pigment, and the variable light shielding unit is disposed to enclose the opening area of each of the plurality of sub pixel and includes a photochromic material which is reversibly discolored in accordance with a wavelength of incident light,
    wherein the organic light emitting diode includes an anode, an organic light emitting layer disposed on the anode, a cathode disposed on the organic light emitting layer, and
    wherein a width of the variable light shielding unit is 0.3 times to 0.7 times a distance between the organic light emitting layer and the black matrix layer.

12. The display device according to claim 11, wherein the photochromic material is discolored to black when light with a first wavelength is irradiated from outside of the display device and is discolored to be transparent when light with a second wavelength is irradiated from the organic light emitting diode.

13. The display device according to claim 11, wherein the photochromic material is one or more of a thiophene-based compound, a benzothiophene-based compound, an azobenzene-based compound, and a spiropyran-based compound.

14. The display device according to claim 11, wherein when ultraviolet ray is irradiated from outside of the display device, the variable light shielding unit is discolored to black to operate in a shielding mode and when visible ray emitted from the organic light emitting diode is irradiated, the variable light shielding unit is discolored to be transparent to operate in a transmission mode.

15. A display device comprising:
   an organic light emitting diode disposed in a plurality of sub pixel areas; and
   a black matrix layer having an opening area that transmits light emitted from the organic light emitting diode and a shielding area including a light shielding unit and a variable light shielding unit,
   wherein the light shielding unit includes a black pigment, and the variable light shielding unit includes a photochromic material,
   wherein the photochromic material is reversibly discolored to black in response to ultraviolet light and reversibly discolored to transparent in response to visible light, and
   wherein the variable light shielding unit is disposed to enclose the opening area of each of the plurality of sub pixel, and
   wherein the variable light shielding unit further includes a transparent polymer bead and has an uneven upper surface.

* * * * *